(12) United States Patent
Lee et al.

(10) Patent No.: US 6,264,804 B1
(45) Date of Patent: Jul. 24, 2001

(54) SYSTEM AND METHOD FOR HANDLING AND MASKING A SUBSTRATE IN A SPUTTER DEPOSITION SYSTEM

(75) Inventors: Ke Ling Lee, Cupertino; Mikhail Mazur, San Francisco; Ken Lee, Mountain View; Robert M. Martinson, San Mateo, all of CA (US)

(73) Assignee: SKE Technology Corp., Mountain View, CA (US)

( * ) Notice: Subject to any disclaimer, the term of this patent is extended or adjusted under 35 U.S.C. 154(b) by 0 days.

(21) Appl. No.: 09/547,522

(22) Filed: Apr. 12, 2000

(51) Int. Cl.$^7$ .......................... C23C 14/32; C23C 14/50; C23C 16/04
(52) U.S. Cl. .................. 204/192.12; 204/298.11; 204/298.14; 204/298.15; 427/526; 118/720; 118/721; 118/728; 118/729; 118/730; 118/503; 118/504
(58) Field of Search .................. 204/298.11, 298.14, 204/298.15, 192.12; 427/526; 118/721, 729, 730, 720, 728, 503, 504

(56) References Cited

U.S. PATENT DOCUMENTS

| | | | |
|---|---|---|---|
| 3,874,525 | 4/1975 | Hassan et al. | 214/17 B |
| 3,915,117 | 10/1975 | Schertler | 118/49 |
| 4,355,937 | 10/1982 | Mack et al. | 414/217 |
| 4,523,985 | 6/1985 | Dimock | 204/298 |
| 4,534,314 | 8/1985 | Ackley | 118/733 |
| 4,548,699 | 10/1985 | Hutchinson et al. | 204/298 |
| 4,588,343 | 5/1986 | Garrett | 414/221 |
| 4,670,126 | 6/1987 | Messer et al. | 204/298 |
| 4,685,852 | 8/1987 | Rubin et al. | 414/404 |
| 4,699,554 | 10/1987 | Kawashima et al. | 414/217 |
| 4,701,251 | 10/1987 | Beardow | 204/298 |
| 4,756,815 | 7/1988 | Turner et al. | 204/298 |
| 4,820,106 | 4/1989 | Walde et al. | 414/217 |

(List continued on next page.)

FOREIGN PATENT DOCUMENTS

| | | |
|---|---|---|
| 684602 | 10/1994 | (CH) . |
| 3411 536 | 1/1985 | (DE) . |
| 3429 988 | 6/1985 | (DE) . |
| 3442 206 | 7/1985 | (DE) . |
| 3441 001 | 5/1986 | (DE) . |
| 3603 646 | 10/1986 | (DE) . |
| 3620 908 | 2/1987 | (DE) . |
| 3604 698 | 8/1987 | (DE) . |
| 3633 386 | 4/1988 | (DE) . |
| 3830 478 | 7/1989 | (DE) . |
| 3803 411 | 8/1989 | (DE) . |

(List continued on next page.)

Primary Examiner—Mark F. Huff
Assistant Examiner—Daborah Chacko-Davis
(74) Attorney, Agent, or Firm—Skjerven Morrill MacPherson LLP; James E. Parsons (57) ABSTRACT

A substrate handling system auxiliary to a plasma sputtering system is described. The substrate handling system inserts an unprocessed substrate (e.g., an optical disk), an inner mask, and an outer mask into a loadlock of the sputtering system, and then seals the access opening to the loadlock. The substrate and the masks then are moved to a sputtering chamber where the substrate is coated by sputtering. Subsequently, the substrate handling system moves a processed substrate, and its accompanying inner mask and an outer mask, from the loadlock to an external disk change station, where the processed substrate is removed from the masks, which are still gripped by the substrate handling system. Subsequently, another unprocessed disk is placed on the inner mask and within the outer mask, and the sequence repeats. The substrate handling system only contacts the masks on surfaces thereof that are not subjected to direct sputter deposition, so that the masks can be gripped without causing particulate contamination. A coated surface of the inner mask and outer mask has numerous asperities to trap sputtered material and reduce contamination.

59 Claims, 9 Drawing Sheets

U.S. PATENT DOCUMENTS

| | | | |
|---|---|---|---|
| 5,240,172 | 8/1993 | Steinke et al. | 228/262.61 |
| 5,259,942 | 11/1993 | Kempf | 204/298.25 |
| 5,354,380 * | 10/1994 | Zejda | 118/721 |
| 5,407,314 | 4/1995 | Kempf | 414/217 |
| 5,451,130 | 9/1995 | Kempf | 414/27 |
| 5,480,530 * | 1/1996 | Zejda | 204/298.11 |
| 5,612,068 | 3/1997 | Kempf et al. | 425/574 |
| 5,669,652 | 9/1997 | Reising et al. | 294/88 |
| 5,674,368 * | 10/1997 | Hashimoto et al. | 204/298.15 |
| 5,791,851 | 8/1998 | Kempf et al. | 414/217 |
| 5,800,687 | 9/1998 | Kempf | 204/298.11 |
| 5,803,521 | 9/1998 | Zejda et al. | 294/97 |
| 5,863,399 * | 1/1999 | Sichmann | 204/298.11 |
| 5,876,082 | 3/1999 | Kempf et al. | 294/95 |
| 5,879,121 | 3/1999 | Kempf | 414/226 |
| 5,913,653 * | 6/1999 | Kempf | 118/503 |
| 4,869,801 | 9/1989 | Helms et al. | 204/298 |
| 4,886,592 | 12/1989 | Anderle et al. | 204/298 |
| 4,938,858 | 7/1990 | Zejda | 204/298.25 |
| 4,943,363 | 7/1990 | Zejda et al. | 204/298.15 |
| 5,112,469 | 5/1992 | Kempf et al. | 204/298.25 |

OTHER PUBLICATIONS

| | | |
|---|---|---|
| 3904 991 | 8/1990 | (DE) . |
| 4117 005 | 12/1991 | (DE) . |
| 4025 077 | 2/1992 | (DE) . |
| 4102 102 | 8/1992 | (DE) . |
| 4111 384 | 10/1992 | (DE) . |
| 4117 368 | 12/1992 | (DE) . |
| 4136 655 | 5/1993 | (DE) . |
| 4138 793 | 5/1993 | (DE) . |
| 4138 794 | 5/1993 | (DE) . |
| 4221 930 | 5/1993 | (DE) . |
| 4203 080 | 8/1993 | (DE) . |
| 4220 588 | 1/1994 | (DE) . |
| 4223 592 | 1/1994 | (DE) . |
| 4225 531 | 2/1994 | (DE) . |
| 4232 007 | 3/1994 | (DE) . |
| 4235 677 | 4/1994 | (DE) . |
| 4235 974 | 4/1994 | (DE) . |
| 4235 678 | 5/1994 | (DE) . |
| 4239 218 | 5/1994 | (DE) . |
| 4235 676 | 6/1994 | (DE) . |
| 4315 023 | 11/1994 | (DE) . |
| 4405 747 | 11/1994 | (DE) . |
| 4424 544 | 3/1995 | (DE) . |
| 4436 176 | 4/1995 | (DE) . |
| 4339 792 | 5/1995 | (DE) . |
| 4410 466 | 9/1995 | (DE) . |
| 4418 906 | 12/1995 | (DE) . |
| 4419 167 | 12/1995 | (DE) . |
| 4420 113 | 12/1995 | (DE) . |
| 195 22 331 | 1/1996 | (DE) . |
| 4426 200 | 1/1996 | (DE) . |
| 195 27 246 | 2/1996 | (DE) . |
| 4426 751 | 2/1996 | (DE) . |
| 3441000 | 5/1996 | (DE) . |
| 0215968 | 9/1985 | (EP) . |
| 0235731 | 2/1987 | (EP) . |
| 0254168 | 7/1987 | (EP) . |
| 0308680 | 8/1988 | (EP) . |
| 0316523 | 8/1988 | (EP) . |
| 0337012 | 12/1988 | (EP) . |
| 0389820 | 3/1990 | (EP) . |
| 0393344 | 3/1990 | (EP) . |
| 0448782 | 11/1990 | (EP) . |
| 0450163 | 12/1990 | (EP) . |
| 0463230 | 12/1990 | (EP) . |
| 0467012 | 2/1991 | (EP) . |
| 0494342 | 9/1991 | (EP) . |
| 0503138 | 10/1991 | (EP) . |
| 0492114 | 11/1991 | (EP) . |
| 0525279 | 2/1992 | (EP) . |
| 0529259 | 7/1992 | (EP) . |
| 0541903 | 7/1992 | (EP) . |
| 0549854 | 7/1992 | (EP) . |
| 0541919 | 8/1992 | (EP) . |
| 0544995 | 8/1992 | (EP) . |
| 0544107 | 10/1992 | (EP) . |
| 0546293 | 10/1992 | (EP) . |
| 0569660 | 1/1993 | (EP) . |
| 0563609 | 3/1993 | (EP) . |
| 0591706 | 9/1993 | (EP) . |
| 0608478 | 9/1993 | (EP) . |
| 0676791 | 4/1994 | (EP) . |
| 0657563 | 5/1994 | (EP) . |
| 0816529 | 3/1997 | (EP) . |
| 0803587 | 7/1997 | (EP) . |
| 0837154 | 7/1997 | (EP) . |
| 0858963 | 12/1997 | (EP) . |
| 0860259 | 12/1997 | (EP) . |
| 2-173 217 | 10/1986 | (GB) . |
| 2 191 787 | 12/1987 | (GB) . |
| 2 271 332 | 4/1994 | (GB) . |
| 2 271 542 | 4/1994 | (GB) . |
| 2 296 698 | 7/1996 | (GB) . |
| 2 298 655 | 9/1996 | (GB) . |
| 2 318 589 | 4/1998 | (GB) . |
| 59-156761 | 9/1984 | (JP) . |
| 4-224679 | 8/1992 | (JP) . |
| 8-195200 | 2/1996 | (JP) . |

* cited by examiner

SYSTEM AND METHOD FOR HANDLING AND MASKING A SUBSTRATE IN A SPUTTER DEPOSITION SYSTEM

FIELD OF THE INVENTION

This invention relates generally to a system for loading and masking substrates in association with a sputter deposition system.

BACKGROUND OF THE INVENTION

A conventional optical disk includes a plastic base upon which layers of various materials, such as metals, alloys, or dielectrics, are applied. One method of applying the layers of materials is to use a sputter deposition process.

A conventional sputter deposition process is performed using a plasma formed in a vacuum chamber of a sputter deposition system. The plasma is generated by applying electric power to a low pressure gas in the vacuum chamber. Ions originating within the plasma bombard a target formed of a material that is to be deposited on the optical disk. The bombarding ions eject material from the target. The ejected material deposits in a layer on the disk.

A conventional sputtering system known as the BALZERS™ BIG SPRINTER™ is believed to include a loadlock between a main vacuum chamber and a disk loader robot. The disk loader robot includes two opposing arms, each of which includes an identical disk holder. An external robot loads an unprocessed optical disk (or other substrate) into the disk holder, and unloads a processed disk from the disk holder. The disk loader robot rotates 180°, and thereby alternatively positions each disk holder at the loadlock and the external robot.

During the sputtering operation, the two masks, one known as an inner mask and one as an outer mask, prevent deposition on the central and peripheral portions of the disk, respectively. The inner mask consists of a solid cylindrical body with an annular head attached to one end of the cylindrical body. At the outside of the cylindrical body is a spring mechanism that traps the disk under the annular head. The outer mask is in shape of a flat ring. The disk holders and the carrier arm hold the masks using magnets. The annular head of the inner mask and the surface of the outer mask that faces in the same direction as the sputtered surface of the disk both get a coating of the sputtered material. Magnetized components of the disk holder and the carrier arm contact the sputtered surfaces of the inner and outer masks during loading and handling processes.

The sputter-coated inner and outer masks need to be replaced periodically. To do this, the disk loader robot is rotated 90°, thereby placing the disk holder with the masks that are to be replaced at a station dedicated to changing of the masks.

There are drawbacks to the above described system that heretofore have not been resolved. First, contacting the sputtered surfaces of the inner and outer masks dislodges sputtered material from the masks, causing particulate contamination on the disk and in the sputtering system. Second, the masks get hot in the vacuum chamber, and have limited opportunities to cool. The hot masks can cause heat damage to the surface of the disk. Third, the use of magnets near the substrate to hold the masks affects the plasma, thereby affecting the uniformity of the film. Fourth, the sputtering system includes a station dedicated to changing of the masks, which consumes valuable space in the machine.

SUMMARY OF THE INVENTION

The present invention overcomes the aforesaid shortcomings of the prior art, while at the same time providing a high throughput and reliable system for loading, unloading, handling, and masking substrates, such as optical disks, that are to be coated with a sputtered material. The surfaces of the masks that are subjected to direct sputter deposition (i.e., the surfaces that face in the same direction as the coated surface of the substrate) are not handled, which avoids the particulate contamination seen in the prior art system.

A sputtering system within the present invention includes a substrate handling system. The substrate handling assembly moves individual unprocessed disks (i.e., disks to be sputter coated) between a disk change station, which is external to the sputtering system, and a loadlock of the sputtering system. The substrate handling assembly moves individual processed disks (i.e., coated disks) between the loadlock and the disk change station. An inner mask and an outer mask accompany each unprocessed disk from the external disk change station, through the sputtering system, and back to the disk change station.

The substrate handling system includes one or more arms. At the end of each arm is a disk and mask handling assembly, which is called an "end effector" herein. In one embodiment, the end effector comprises a lid that fits over an access opening to the loadlock. The end effector also includes an inner mask gripper and an outer mask gripper. The inner mask gripper grips the inner mask, and the outer mask gripper grips the outer mask.

The inner mask is generally mushroom shaped and fits in a hole in the center portion of the disk. Unlike the prior art inner mask, however, the inner mask of the present invention has a central cylindrical opening that is accessed through the annular head. The inner mask gripper grips the inner mask on a sidewall surface within the cylindrical opening that is not subjected to direct sputter deposition.

The outer mask has a hollow vertically-extending body with a central opening that is sized so that a disk can be horizontally disposed within the central opening. A lip at the top of the body superimposes a circumferential portion of the disk. The outer mask gripper grips the outer mask on an outer surface of a vertically-extending sidewall of the body of the outer mask. The gripped surface is not subjected to direct sputter deposition.

In one embodiment, the substrate handling system operates by positioning an end effector that is gripping an inner mask and an outer mask at the external disk change station. An unprocessed disk is placed and centered on the inner mask and within outer mask. The substrate handling system moves the end effector to the loadlock, places the unprocessed disk and masks into the loadlock, and seals the access opening to the loadlock with the lid. The end effector pushes the inner mask and outer mask onto a substrate transfer tray positioned in the loadlock. The masks are released by the end effector. The disk and its accompanying inner and outer masks then move on the tray to a sputtering station. Subsequently, after a tray having a processed disk and inner and outer masks is moved into the loadlock, the load lock is vented, and the end effector at the loadlock grips the inner and outer masks on unsputtered surfaces thereof, thereby capturing the processed disk. The substrate handling system moves the end effector to the disk change station, where the processed disk is removed from the inner and outer masks. The cycle subsequently repeats. The design of the system allows high throughput loading and unloading of the disks.

Further features and advantages of the invention will become apparent in view of the drawings and detailed description of the exemplary embodiments.

DETAILED DESCRIPTION

Figure 1:
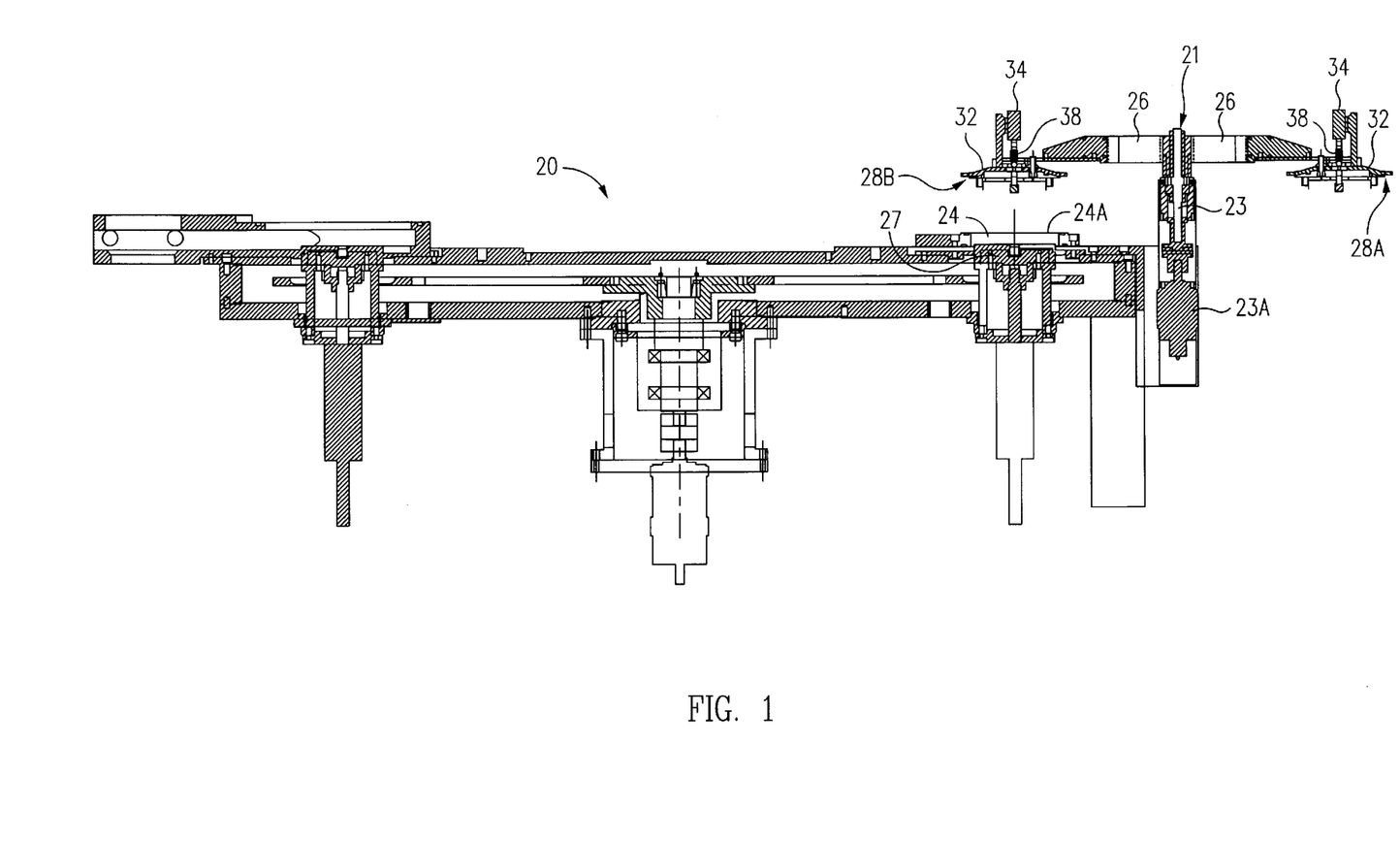
FIG. 1 is a cross-sectional side view of a substrate handling system mounted on a sputtering system.

FIG. 1 illustrates portions of an embodiment of a sputtering system within the present invention. Sputtering system 20 sputters layers of material onto the surface of a substrate using a plasma formed in each of several sequential sputtering stations. The disks and their accompanying inner and outer masks move from station to station on a carousel. In the example embodiments described herein, the substrate is an optical disk, but the type of substrate may vary. Other features that may be part of sputtering system 20 are disclosed in a commonly-assigned co-pending U.S. patent application entitled "Magnetic Array for Sputtering System," Ser. No. 09/499,092, which was filed on Feb. 4, 2000, and is incorporated herein by reference in its entirety.

Sputter system 20 includes a loadlock 24 that is used for loading and unloading optical disks. A substrate handling system 21 is mounted to sputtering system 20 adjacent to loadlock 24. In this embodiment, substrate handling system 21 includes two opposing arms 26 on a shaft 23 that rotates and moves vertically. The number of arms can vary, however, as is discussed below. Handling system 21 loads unprocessed disks into loadlock 24 and unloads processed disks from loadlock 24 through access opening 24A in loadlock 24. This loading and unloading process is repeated over and over by handling system 21.

An end effector 28A is present at the end of one arm 26 of substrate handling system 21, and an end effector 28B is attached to the opposing arm 26. Each end effector 28A, 28B includes an inner mask gripper and an outer mask gripper. When handling system 21 rotates, end effectors 28A and 28B are moved between loadlock 24 and the external disk change station. A conventional electric motor 23A rotates and lifts arms 26 and shaft 23.

Figure 2:
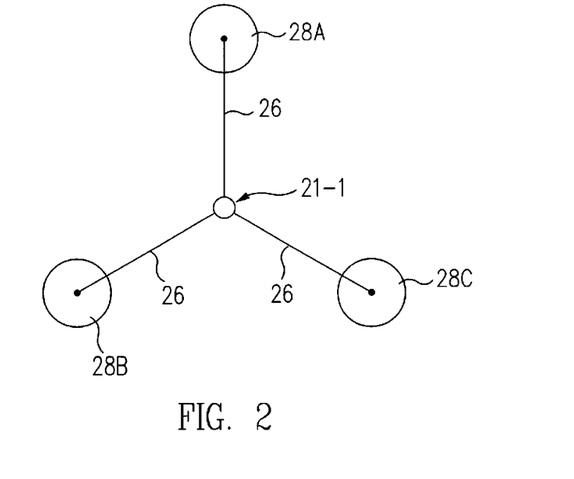
FIG. 2 is a simplified top plan view an alternative substrate handling system having three arms.

The number of arms on substrate handling system 21 can vary. At a minimum, handling system 21 has one arm 26 that supports a single end effector. FIG. 2 is a simplified top plan view of alternative handling system 21-1 that includes three arms 26, which respectively support identical end effectors 28A, 28B, and 28C. When such a system is in use, end effector 28A may be positioned at loadlock 24 (FIG. 1), end effector 28B may be at an external station where processed disks are removed from end effector 28B, and end effector 28C may be at an external station where unprocessed disks are placed on end effector 28C. Rotation of substrate handling system 21-1 moves each arm to the next station. The methods used at the external disk change station to remove processed disks from the end effector and to load unprocessed disks onto the end effector may vary.

Each end effector 28A, 28B of FIG. 1 includes a lid 32 that is located vertically between arm 26 and the inner mask gripper and the outer mask gripper. During the loading and unloading process, lid 32 is placed over opening 24A in loadlock 24. When lid 32 is placed over opening 24A, lid 32 closes the opening and forms a vacuum seal. An O-ring seal may be provided around opening 24A or on lid 32 to help form the gas tight seal.

Figure 3:
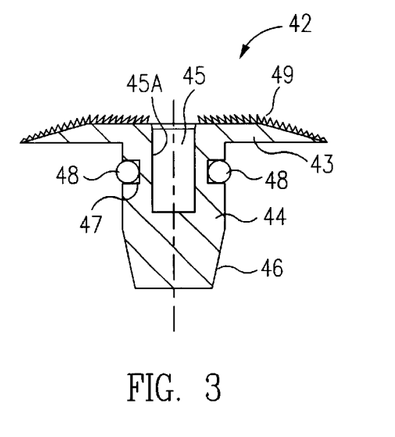
FIG. 3 is a cross-sectional side view of an inner mask.

FIG. 3 is a cross-sectional view of a first embodiment of an inner mask 42. Inner mask 42 is generally mushroom shaped, and includes an annular head 43 integrally connected to a first end of a vertically-extending body 44. Body 44 has tapered sides 46 at an opposite second end of body 44, and an orthogonal portion between head 43 and tapered sides 46. Body 44 has a hollow cylindrical aperture 45 that begins at the center of annular head 43 and extends vertically into body 44. While the circumference of aperture 45 is circular in this embodiment, the shape may vary. The width and depth of central aperture 45 are sufficient to allow the gripper fingers of the inner mask gripper to be inserted into aperture 45 and achieve a firm grip on sidewall 45A of aperture 45. A groove 47 is present around the orthogonal portion of the outer surface of body 44 adjacent to aperture 45 and just below head 43. A circular steel helical spring 48 is in groove 47 around body 44 and extends slightly beyond the sides of body 44.

An optical disk having a central aperture is captured on inner mask 42 by inserting the tapered end of body 44 through the aperture in the disk. Spring 48 deflects and allows the disk to move upward toward head 43. Once the disk is past, spring 48 springs back, and captures the disk under head 43. Head 43 extends over the surface that is to be coated, and thereby masks a central circular portion of the disk during the sputtering process.

Inner mask 42 may be formed from aluminum, steel, or other materials. All or part of the upper surface of annular head 43 (which is exposed to direct sputter deposition) has a rough surface that includes many asperities 49 that can trap sputtered material. Accordingly, material sputtered onto annular head 43 does not fall on and contaminate the disk. The asperities may be provided by spraying the upper surface of annular head 44 with an aluminum ARC spray. The coating gets rougher going from the outer perimeter of head 43 toward aperture 45.

Figure 4:
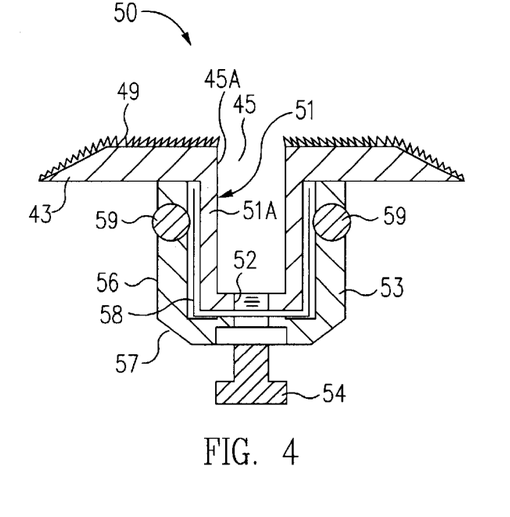
FIG. 4 is a cross-sectional side view of an alternative inner mask.

FIG. 4 is an exploded view of an alternative inner mask 50. Features similar to inner mask 42 of FIG. 3 have similar reference numbers. Mask 50 is an assembly of several parts, including a first body 51 having a vertically-extending cylindrical portion 51A and an integral annular head 43 with asperities 49 thereon. Cylindrical portion 51A has a central cylindrical aperture 45 with an inner vertical sidewall 45A. A screw hole 52 is at the bottom of cylindrical portion 51A. First body 51 is within a hollow second body 53. The outer surface of second body 53 includes an orthogonal upper portion 56 and a tapered lower portion 57. A strip 58 of spring steel is between first body 51 and second body 53. A screw 54 extends through a hole 55 in second body 53 and a hole in strip 58 and engages the threads of screw hole 52 of first body 51. Screw 54 thus secures first body 51 to second body 52. Orthogonal portion 56 of second body 53 includes one or more (e.g., two or four) chamfered openings in which a steel ball 59 is held. As a disk passes up second body 53, the sidewall of the central aperture of the disk contacts balls 59 and causes balls 59 to deflect inward. After the disk moves past balls 59, spring 58 pushes balls 59 outward, which causes the disk to be captured under head 43.

Figure 5:
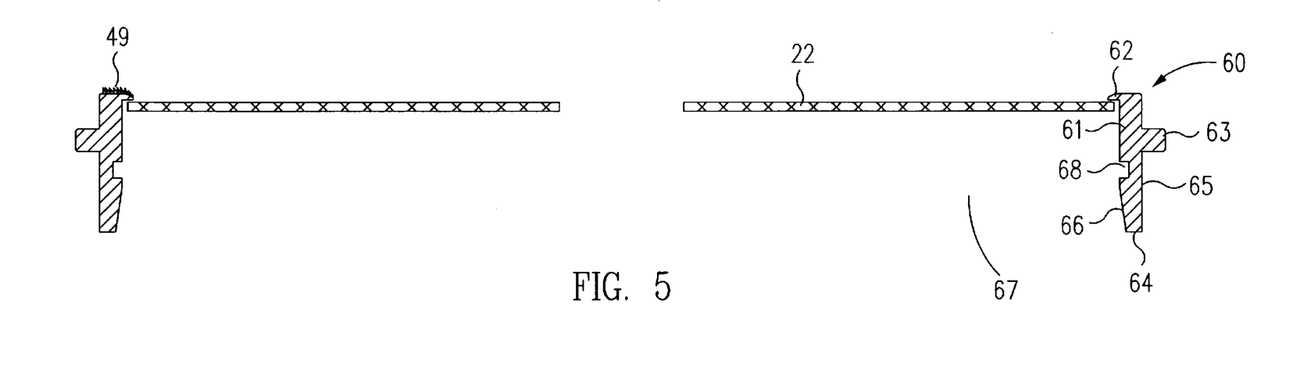
FIG. 5 is a cross-sectional side view of an outer mask.

FIG. 5 is a cross-sectional side view of a first embodiment of an outer mask 60. Outer mask 60 is formed of aluminum, steel, or another material.

Outer mask 60 includes a hollow, vertically-extending body 61. Outer mask 60 is sized so that a disk 22 will fit horizontally within the round central aperture 67 of body 61. A lip 62 is at an upper first end of body 61 and extends inwardly around aperture 67. Lip 62 extends over a circumferential portion of disk 22, and thereby masks the outer periphery of disk 22 during the sputtering process. Lip 62 does not contact the sputtered surface of the disk. The upper surface of lip 62 (which is exposed to direct sputter deposition) has numerous asperities 49 thereon to catch sputtered material, although asperities 49 may be omitted. A horizontal flange 63 extends outwardly from an outer surface of body 61. In one embodiment, flange 63 may be present around the entire outer surface 65 of body 61. In other embodiments, one or more (e.g., four) discrete flanges or other protrusions may be spaced around the outer surface 65 of body 61. The inner surface of body 61 includes a tapered portion 66 adjacent to end 64, where disk 22 enters aperture 67. The inner surface of body 61 also includes a groove 68, which is engaged by a helical spring 41 (FIG. 7) in the tray 39 upon which disk 22 rests during the sputtering process. The outer mask gripper of the end effector grips mask 60 on the unsputtered outer surface 65 of body 61 beneath flange 63, and may use the lower surface of flange 63 to lift outer mask 60.

Figure 6:
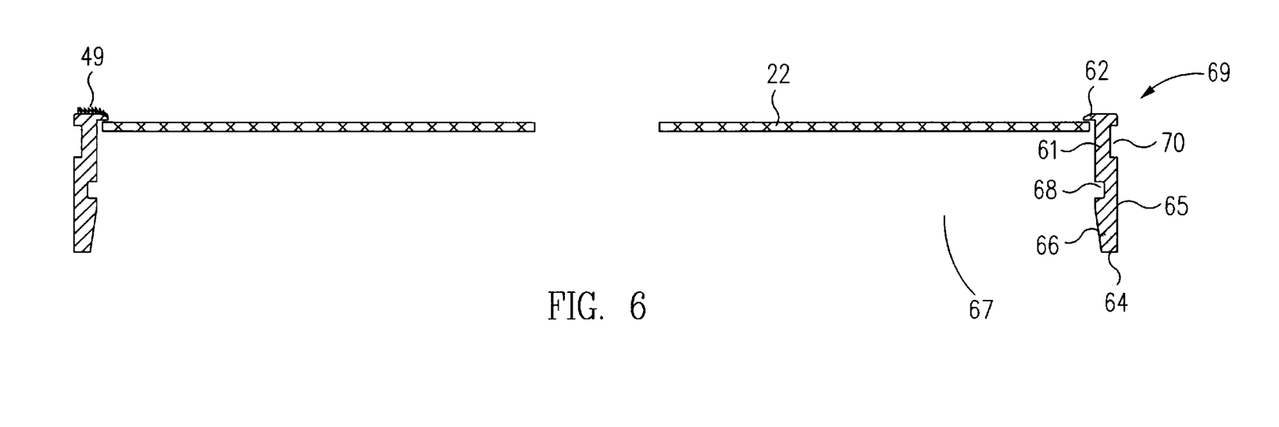
FIG. 6 is a cross-sectional side view of an alternative outer mask.

FIG. 6 is a cross-sectional side view of an alternative outer mask 69. Most of the features of outer mask 69 are the same as those of outer mask 60 of FIG. 5. Instead of having a flange 63, however, outer mask 69 has a groove 70 in outer surface 65 that is engaged by the outer mask gripper of the end effector.

Figure 7:
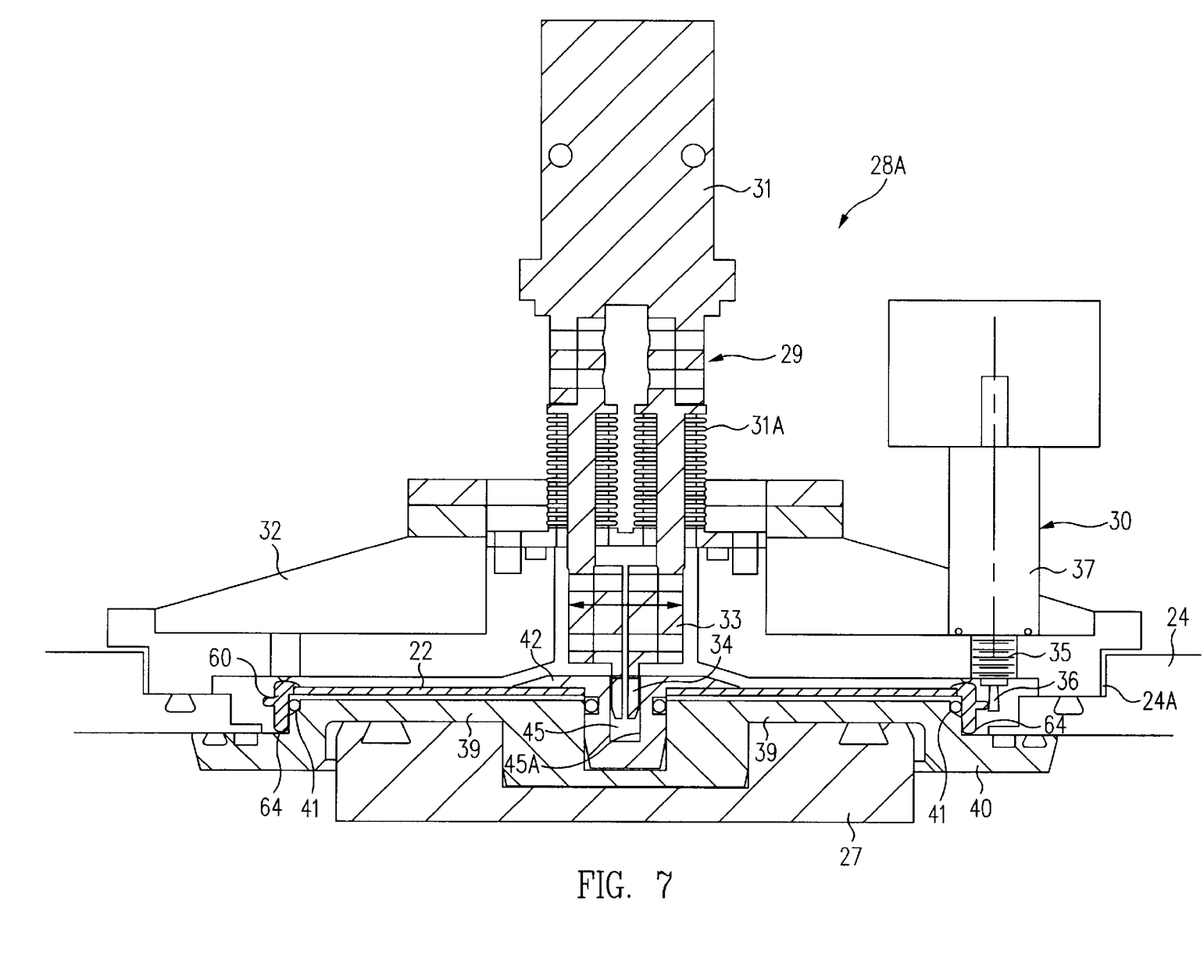
FIG. 7 is a cross-sectional side view of an end effector.

FIG. 7 is a cross-sectional view of a first embodiment of an end effector 28A (or 28B) of FIG. 1. In this view, end effector 28A is positioned at loadlock 24 (FIG. 1) so that lid 32 is covering loadlock opening 24A. End effector 28A includes an inner mask gripper 29 and an outer mask gripper 30, the component parts of which are described below. Inner mask gripper 29 is gripping inner mask 42, and outer mask gripper 30 is gripping outer mask 60.

Disk 22 of FIG. 7 is captured and centered on inner mask 42, and is horizontally disposed within outer mask 60. Disk 22 rests horizontally on a metal tray 39, which in turn rests on a vertically moveable pedestal 27 (FIG. 1). In particular, disk 22 is supported on flat-topped annular protrusions that extend from the top surface of tray 39. The protrusions are located near the center of disk 22 and at the periphery of disk 22, respectively.

Tray 39 also supports inner masks 42 and outer mask 60. Body 44 (FIG. 3) of inner mask 42 is supported in a central aperture in tray 39. Spring 48 (FIG. 3) of inner mask 42 presses against the sidewall of the central aperture in tray 39, and thus provides a supportive engagement with tray 39. Second end 64 (FIG. 4) of outer mask 60 is supported above an outwardly extending flange 40 of tray 39. A helical spring coil 41 in a groove around tray 39 engages groove 58 (FIG. 5) on the inside surface of body 61 of outer mask 60 and applies an outward force, thereby supporting and securing outer mask 60 to tray 39. The metal to metal contacts between inner mask 42 and outer mask 60, on the one hand, and tray 39 on the other allow heat from the plasma to be conducted from inner mask 42 and outer mask 60 to tray 39, which prevents heat damage to disk 22.

Pedestal 27 is vertically raised to bring a processed disk 22, tray 39, inner mask 42, and outer mask 60 from the carousel carrier in the main vacuum chamber to loadlock 24. Pedestal 27 is vertically lowered to bring an unprocessed disk 22, tray 39, inner mask 42, and outer mask 60 to the carousel carrier from loadlock 24.

Inner mask gripper 29 includes gripper fingers 34 that are inserted into aperture 45 of inner mask 42. Gripper fingers 34 are connected to gripper arms 33. A linear actuator 31 and a bellows 31A cause gripper arms 33 and gripper fingers 34 to move laterally back and forth, as shown by the two headed arrow of FIG. 7. When gripper arms 33 are moved apart (the "open" position), gripper fingers 34 push against inner wall 45A of aperture 45 of inner mask 42 with sufficient force to allow inner mask 42 and disk 22 to be lifted and moved. When gripper fingers 34 are moved together (the "closed" position), inner mask 42 is released onto tray 39. Gripper fingers 34 may be threaded to enhance their grip on inner mask 42. Inner mask 50 of FIG. 4 may be used instead of inner mask 42.

A feature of inner mask gripper 29 is that inner masks 42 and 50 are only gripped on vertically-extending sidewall 45A within aperture 45, which is not subjected to direct sputter deposition. Artisans will appreciate that numerous methods may be implemented for gripping the inner mask within central aperture 45.

Figure 8:
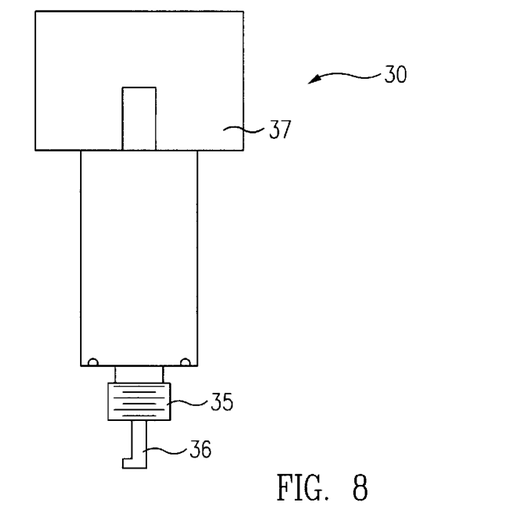
FIG. 8 is a perspective view of a rotary actuated outer mask gripper.

Outer mask gripper 30 of FIG. 7 is shown in an enlarged view in FIG. 8. Threads 35 mount outer mask gripper 30 to lid 32. Outer mask gripper 30 includes a rotary actuator 37 that rotates an "L" shaped cam 36 that grips outer mask 60 (FIG. 5). When actuator 37 rotates cam 36 into the "open" position, the horizontal portion of cam 36 is positioned beneath flange 63 (FIG. 5) so that outer mask 60 may be lifted by cam 36. When actuator 37 rotates cam 36 into a "closed" position, cam 36 is positioned so that there is no overlap between cam 36 and flange 63, thereby releasing outer mask 60.

Figure 9A:
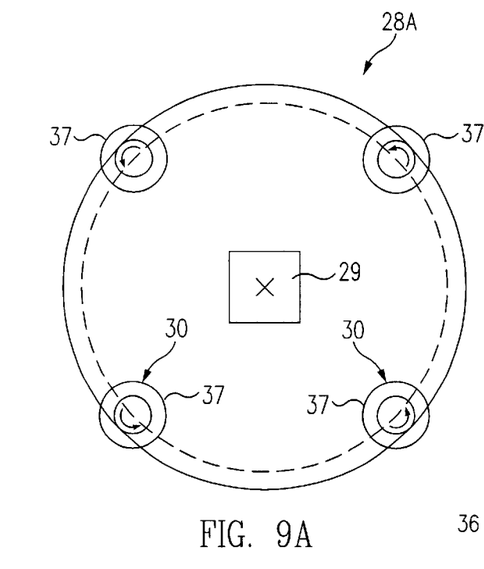
FIG. 9A is a simplified top plan view of an end effector having four rotary actuated outer mask grippers.

The number of outer mask grippers 30 of end effector 28A may vary. For example, FIG. 9A is illustrates an end effector 28A having four outer mask grippers 30 at 90 degree angles to each other. In an alternative embodiment, two or three outer mask grippers 30 may be used.

Figure 9B:
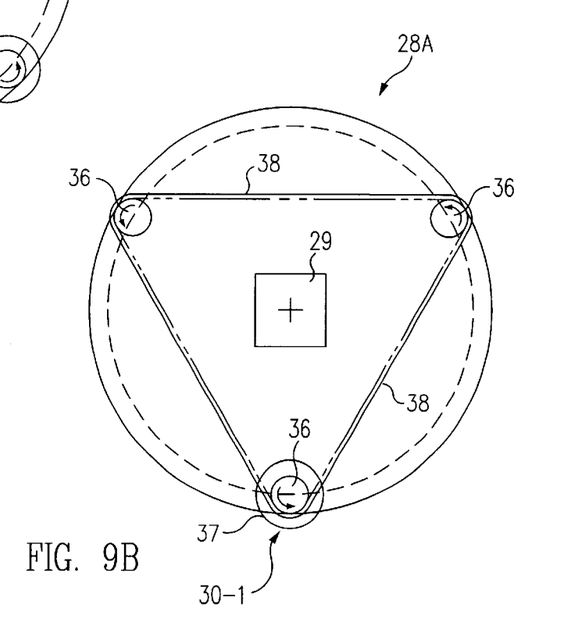
FIG. 9B is a simplified top plan view of an end effector having one rotary actuated outer mask gripper and a belt.

FIG. 9B illustrates another embodiment an outer mask gripper 30-1 for end effector 28A. In this embodiment, one rotational actuator 37 is used to control three cams 36. The cams 36 are connected by a timing belt 38 that provides for synchronized motion. The rotation of actuator 37 to the "open" position moves each of the cams 36 beneath flange 63 in a coordinated fashion. Inner mask gripper 29 is within timing belt 38.

Figure 10:
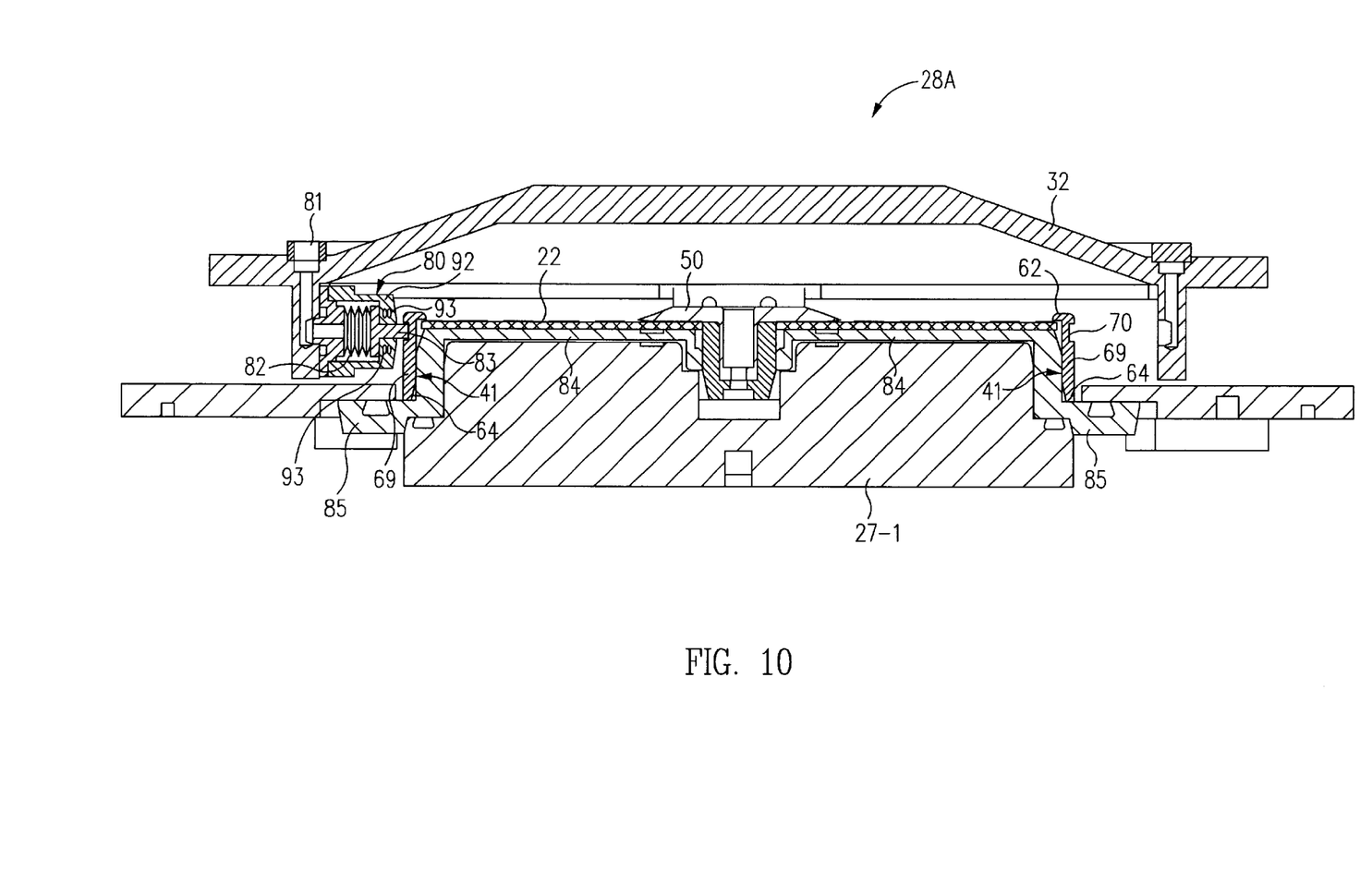
FIG. 10 is a cross-sectional side view of a portion of an alternative outer mask gripper for use with an outer mask.

FIG. 10 is a simplified view alternative embodiment of end effector 28A for use with outer mask 69 of FIG. 6. For simplicity, inner mask gripper 29 is not shown. In this embodiment, each of four outer mask grippers 80 includes a pneumatic actuator, air passage 81 (shown in part), and bellows 82. When outer mask gripper 80 is in an "open" position, a plunger 83 is moved toward outer mask 69. Plunger 83 moves toward outer mask 69 and engages groove 70 of outer mask 69 (FIG. 6), thereby gripping outer mask 69. When the pneumatic pressure is released, springs 93 in hollow cylindrical body 92 force plunger 83 outward, thereby moving gripper 20 to the "closed" position and releasing outer mask 69.

In FIG. 10, end 64 of outer mask 69 is resting on a flange 85 of a metal substrate transport tray 84. Tray 84 supports disk 22, inner mask 50 and outer mask 69 on the carousel and in the sputtering chambers, similar to tray 39 of FIG. 7. Tray 84 has a central aperture in which inner mask 50 is inserted and supported. Tray 84 is on a vertically moveable pedestal 27-1, which is similar to pedestal 27 of FIG. 7.

Figure 11:
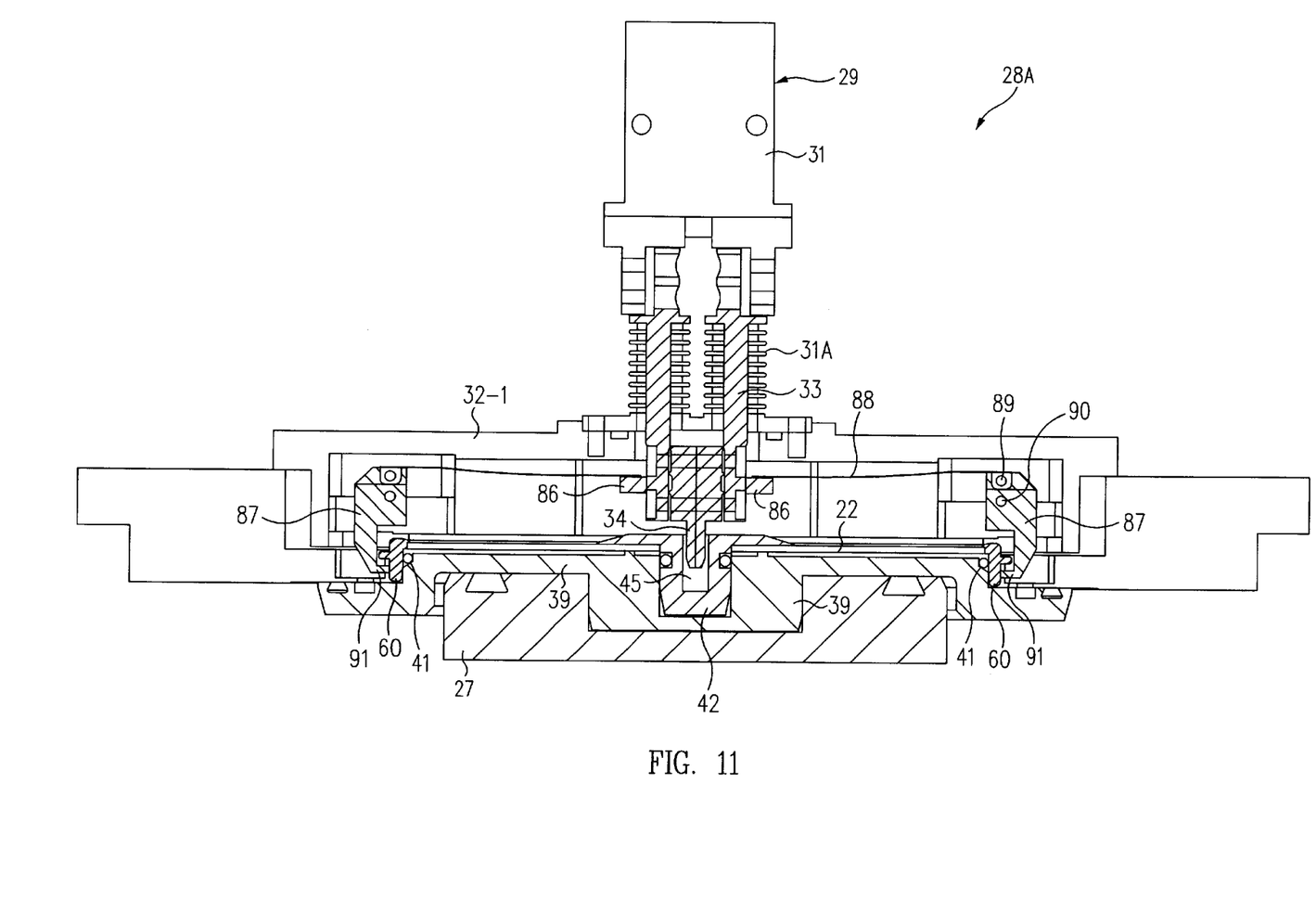
FIG. 11 is a cross-sectional side view of an end effector having an alternative outer mask gripper.

FIG. 11 illustrates pertinent portions of an alternative embodiment of an end effector 28A. In this embodiment, only a single actuator and a single feed-through are used to grip both the inner mask and the outer mask. In addition, lid 32-1 is flat, rather than peaked like lid 32 of FIG. 7.

In FIG. 11, inner mask gripper 29 is the same as shown in FIG. 7, except that inner mask gripper arm 33 includes a flange 86 that extends outwardly from each arm 33. A flexure 88 of steel, spring steel, or the like is connected between flange 86 and a metal (e.g., steel or aluminum) outer mask gripper 87. Outer mask gripper 87 has roughly a "C" shape and is supported on pin 90. Pin 89 links movement from gripper arm 33 and slides and rotates pin 90. Flexure 88 is connected to pin 89.

When inner mask gripper 29 moves gripper arms 33 and gripper fingers 34 to an "open" position so as to engage inner mask 42, flexure 88 moves laterally outward, which causes outer mask gripper 87 to rotate towards outer surface 65 of outer mask 60 (FIG. 5). A horizontal gripper finger 91 of outer mask gripper 87 is thereby positioned closely beneath flange 63 of outer mask 60 (FIG. 5) so that outer mask 60 may be lifted by finger 91 of outer mask gripper 87. When inner mask gripper 29 moves gripper arms 33 and gripper fingers 34 to a closed position, flexure 88 moves laterally inward, which causes outer mask gripper 87 to be rotated away from outer mask 60 so that there is no longer any overlap between flange 63 and finger 91, and thereby releases outer mask 60.

Thus, in the embodiment of FIG. 11, the motion of inner mask gripper 29 is used to cause a gripping of both inner mask 42 and outer mask 60. Other ways of borrowing the motion of inner mask gripper 29 to grip outer masks 60 or 69 (FIGS. 5 and 6) will be readily apparent to practitioners of the mechanical arts. Such methods include using cables and/or linkages. Conversely, the motion of an outer mask gripper 30 of FIG. 7 could be borrowed to grip inner masks 42 or 50 in alternative embodiments.

A feature of the outer mask grippers shown in FIGS. 7 through 11 is that outer masks 60 and 69 are only gripped on an outer surface that is not subject to direct sputter deposition. Artisans will appreciate that numerous methods may be implemented for gripping the unsputtered portion of the outer mask other than using the example methods shown herein.

Figure 12A:
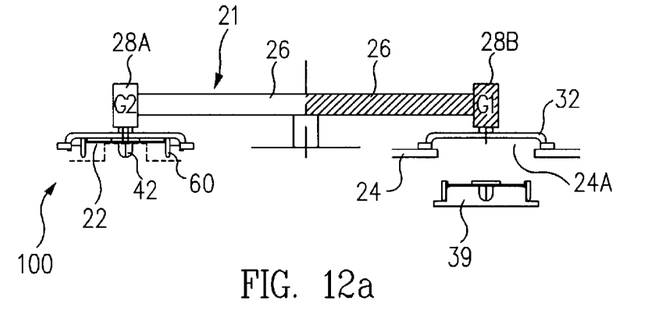
FIGS. 12a–12f are cross-sectional side views of stages in the operation of substrate handling system.

The operation of the substrate handling system 21 of FIG. 1 will be described with the aid of FIGS. 12a–12f. FIG. 12a shows substrate handling system 21 in a down position. End effector 28A is located at an external disk change station 100. Inner mask 42 and outer mask 60 are gripped (i.e., "open" position) by the inner mask gripper and outer mask gripper, respectively, of end effector 28A. A vacuum system or some other disk loading system at disk change station 30 is used to place an unprocessed disk 22 onto inner mask 42 and within outer mask 60. While inner mask 42 and outer mask 60 are at disk changing station 30, and in route to and from disk changing station 30, masks 42 and 60 are exposed to ambient and therefore can cool.

Meanwhile, the opposing end effector 28B is located at loadlock 24 of sputtering system 20. End effector 28B is not engaged with a disk 22, inner mask 42, or outer mask 60, but the carousel of sputtering system 20 has been indexed to position a processed optical disk 22, inner mask 42, outer mask 60, and tray 39 beneath end effector 28B. As mentioned above, inner mask 42, outer mask 60, and tray 39 accompany disk 22 on the carousel and to the sputtering stations of sputtering system 20. The inner mask gripper and outer mask grippers are in a "closed" position. Lid 32 of end effector 28B covers opening 24A of loadlock 24.

Figure 12B:
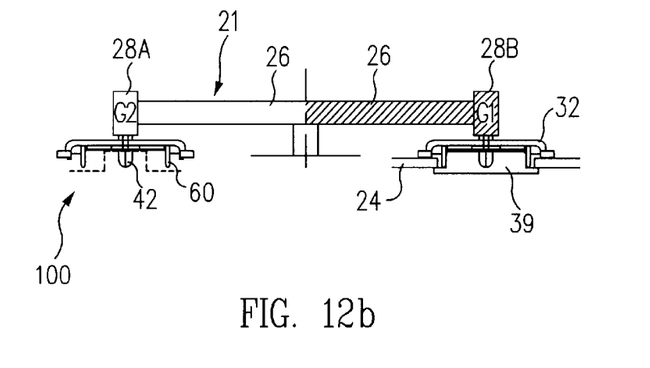

FIG. 12b has pedestal 27 of sputtering system 20 (FIG. 1) in up position. Pedestal 27 moves a processed disk 22, masks 42 and 60, and tray 39 to meet loadlock 24 and end effector 28B. Tray 39 also seals the lower access to loadlock 24 when pedestal 27 is in its up position, which isolates loadlock 24 from the main vacuum chamber of sputtering system 20. After pedestal 27 has risen, loadlock 24 vents to the atmosphere. After the venting is complete or during venting, the inner mask gripper and outer mask gripper of end effector 28B are moved to their respective open positions so that processed inner mask 42 and outer mask 60 are gripped by end effector 28B, thereby capturing disk 22A.

Figure 12C:
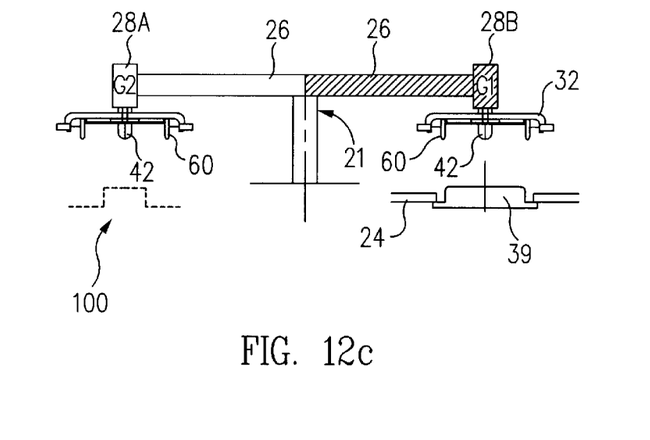

FIG. 12c shows substrate handling system 21 in an up position, which raises end effectors 28A and 28B. End effector 28B is gripping a processed disk 22, inner mask 42, and outer mask 60, and end effector 28A is gripping an unprocessed disk 22, inner mask 42, and outer mask 60. Tray 39 stays in loadlock 24 and pedestal 27 stays up.

Figure 12D:
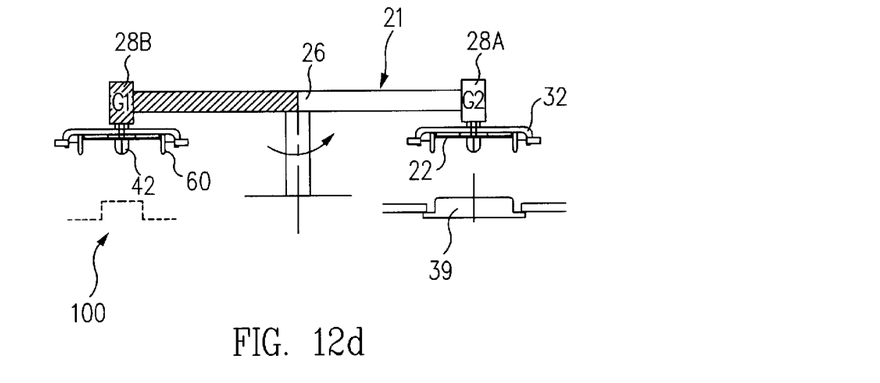

Next, as illustrated in FIG. 12d, substrate handling system 21 is rotated by 180 degrees, thereby locating end effector 28B at disk change station 100, and end effector 28A at loadlock 24. Pedestal 27 remains in an up position at loadlock 24.

Figure 12E:
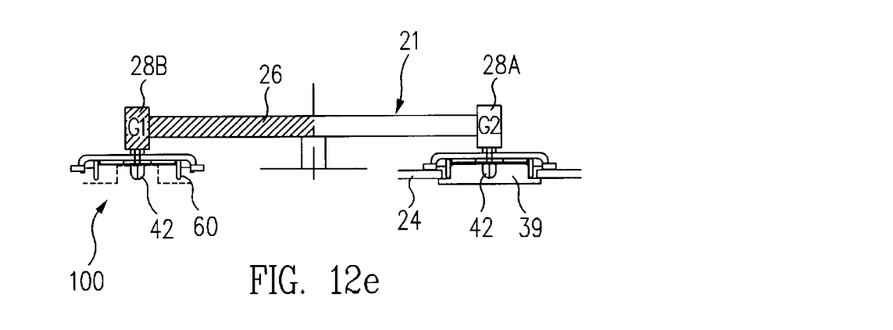

FIG. 12e shows substrate handling system 21 having returned to a down position. At disk change station 100, the unloading of processed disk 22 from inner mask 42 of end effector 28B (and the subsequent loading of another unprocessed disk 22 onto inner mask 42 and within outer mask 60 of end effector 28B) is accomplished by the vacuum apparatus or other mounting system at disk change station 100.

At loadlock 24 of FIG. 12e, lid 32 of end effector 28A is placed over access opening 24A of loadlock 24 so as to form a vacuum tight seal. End effector 28A pushes inner mask 42 and outer mask 60 onto tray 39, securing masks 42 and 60 to tray 39. The inner mask gripper and outer mask gripper are moved to the "closed" position, thereby releasing the unprocessed disk 22, inner mask 42 and outer mask 60 onto tray 39. Next, loadlock 24 is pumped down to create a vacuum.

Figure 12F:
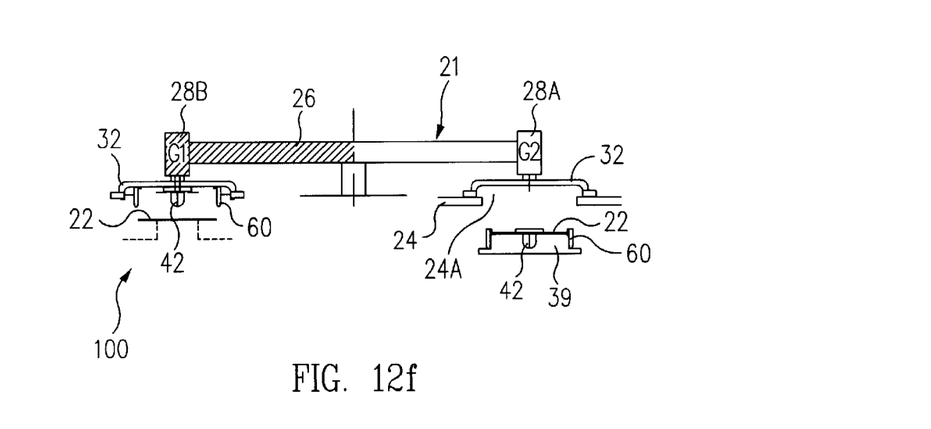

FIG. 12f illustrates processed disk 22 after its separation from end effector 28B at disk changing station 100. Disk changing station 100 subsequently exchanges the processed disk with an unprocessed disk 22. Meanwhile, at loadlock 24, pedestal 27 is lowered through an aperture in the carousel so that unprocessed disk 22, inner mask 42, outer mask 60, and tray 39 are placed on the carousel system of sputtering system 20. Subsequently, the carousel indexes while the plasma is off. The indexing of the carousel locates another processed disk 22, inner mask 42, outer mask 60, and tray 39 under end effector 28A. Whereupon, the cycle described above is repeated, so that end effector 28A removes a processed disk 22 from loadlock 24, and end effector 28B provides an unprocessed disk 22 to loadlock 24. Substrate handling system 21 is capable of handling several thousand disks per day.

The material that is being sputtered onto disk 22 also coats the upper surfaces of annular head 43 of inner mask 42 and lip 62 of outer mask 60 (FIGS. 3 and 5). Over time, the edges of annular head 43 and circular lip 62 become irregular and extended further. The combined effect of the deposition on the annular head 43 and circular lip 62 is a reduction in coated surface area on the disk and irregularity in the coated area boundaries. When this deposition or other maintenance issues have made inner mask 42 and outer mask 60 unusable, they are replaced by a new or refurbished inner mask 42 and outer mask 60. Deteriorated inner mask 42 and outer mask 60 are removed at disk change station 100 by closing the inner mask gripper and outer mask gripper, thereby releasing inner mask 42 and outer mask 60. A new inner mask 42 and outer mask 60 are provided for gripping by the end effector. There is no need for a special mask change station, nor is there any need for venting sputtering system 20 to change the masks.

The embodiments described above are exemplary only. Variations will be apparent to artisans in view of the above disclosure. The invention is limited only by the following claims.

What is claimed is:

1. A mask for use in a sputtering system wherein a substrate having a central opening is to be coated with a material, said mask comprising:
   a transportable body having a central aperture at a first end thereof, said body being insertable into said central opening in the substrate; and
   an annular head at the first end of said body around said central aperture, said head extending away from the central aperture, wherein a surface of the annular head includes numerous asperities, said surface being oriented so as to be exposed to direct sputter deposition.

2. The mask of claim 1, wherein the surface of the annular head with the asperities thereon increases in roughness in a direction from a perimeter of said annular head toward said central aperture.

3. The mask of claim 1, further comprising a resilient protrusion on an outer surface of said body adjacent to the annular head, said protrusion adapted to fit through said central opening and support said substrate.

4. The mask of claim 1, wherein the central aperture has a bottom surface within said body between the first end and an opposite second end of said body.

5. A mask for use in a sputtering system wherein a first surface of a substrate is to be coated with a material, said mask comprising:
   a hollow body having a central aperture and a vertically extending sidewall bounding said aperture, said central aperture sized so that the substrate can be horizontally disposed within said aperture; and
   a lip at a first end of the body around said central aperture, said lip extending toward said central aperture,
   wherein said mask is moveable within the sputtering system with said substrate, and said lip does not contact the first surface of the substrate.

6. The mask of claim 5, wherein the sidewall includes an outer surface, said outer surface having at least one groove therein.

7. The mask of claim 5, where the sidewall includes an outer surface, and at least one flange extends outwardly from the outer surface.

8. The mask of claim 5, wherein a surface of said lip includes numerous asperities, said surface being oriented so as to be exposed to direct sputter deposition.

9. A masking system for use in a sputtering system, wherein a first surface of a substrate having a central first aperture is to be coated with a material, said masking system comprising:
   an inner mask and an outer mask that are transportable with the substrate within the sputtering system;
      said inner mask including a first body having a central second aperture at a first end thereof, said first body being insertable into said first aperture in the substrate, and an annular head at the first end of said first body around said second aperture, said head extending away from the second aperture, and
      said outer mask including a hollow second body having a central third aperture and a vertically extending sidewall bounding said third aperture, said third aperture provided so that the substrate can be horizontally disposed within said third aperture, and a lip at a first end of the second body around said third aperture, said lip extending toward said third aperture,
      wherein said lip does not contact the first surface of the substrate.

10. The masking system of claim 9, wherein at least one of said annular head and said lip include a surface having numerous asperities thereon, said surface being oriented so as to be exposed to direct sputter deposition.

11. The masking system of claim 10, wherein said annular head and said lip include a surface having numerous asperities thereon, said surface being oriented so as to be exposed to direct sputter deposition.

12. The masking system of claim 9, wherein the central aperture of the first body of the inner mark has a bottom surface within said body between the first end and an opposite second end of said body.

13. A substrate handling system auxiliary to a sputtering system, said substrate handling system for transporting into and out of the sputtering system a substrate, an inner mask for masking a central portion of the substrate, and an outer mask for masking a circumferential portion of the substrate, said substrate handling system comprising:
   an inner mask gripper and an outer mask gripper selectively operable to grip the inner mask and outer mask, respectively,
   wherein during said transporting into and out of the sputtering system said inner mask gripper grips the inner mask on a surface thereof that is not subjected to direct sputter deposition, said substrate being supported by said inner mask, and the outer mask gripper grips the outer mask on a surface thereof that is not subjected to direct sputter deposition.

14. The substrate handling system of claim 13, further comprising:
   at least one arm upon which an inner mask gripper and outer mask gripper are mounted; and
   a lid sized so as to seal a loadlock opening of said sputtering system when said inner mask gripper and said outer mask gripper are within said opening.

15. The substrate handling system of claim 13, further comprising an actuator, wherein actuation of said actuator operates both said inner mask gripper and said outer mask gripper.

16. The substrate handling system of claim 13, further comprising plurality of outer mask grippers that grip the outer mask.

17. The substrate handling system of claim 13, wherein said inner mask gripper includes at least one member that is adapted to be inserted vertically into a vertically extending central aperture of said inner mask and to grip said inner mask within said aperture.

18. The substrate handling system of claim 13, wherein said outer mask gripper includes a member that is adapted to engage a groove in the outer mask.

19. The substrate handling system of claim 13, wherein the outer mask gripper includes a member that is adapted to contact the outer mask beneath an outward extension of said outer mask.

20. A method of handling a substrate assembly in association with a sputtering system, said substrate assembly including a substrate, an inner mask for masking a central portion of a first surface of the substrate, and an outer mask for masking a circumferential portion of the first surface of the substrate, said method comprising:

selectively gripping said inner mask on a surface thereof that is not subjected to direct sputter deposition, wherein said inner mask holds said substrate;

selectively gripping said outer mask on a surface thereof that is not subjected to direct sputter deposition; and transporting said substrate assembly to or from the sputtering system while gripping the inner mask and outer mask.

21. The method of claim 20, wherein the inner mask includes a body having a first end and a central aperture at said first end that extends vertically through the body, and the inner mask is gripped within said aperture.

22. The method of claim 20, wherein the outer mask includes a hollow body having a vertically extending sidewall and the outer mask is gripped on an outer surface of said sidewall.

23. The method of claim 22, wherein the inner mask includes a body having a first end and an aperture at said first end, and the inner mask is gripped within said aperture.

24. The method of claim 23, further comprising using a single actuator to cause the gripping of the inner mask and the outer mask.

25. The method of claim 20, wherein the inner mask and the outer mask are gripped at a plurality of points.

26. The method of claim 20, wherein the substrate assembly is transported to the sputtering system, and further comprising:

inserting the substrate assembly into a loadlock of the sputtering system while gripping the inner and outer masks, and then covering an external opening of the loadlock of the sputtering system.

27. The method of claim 20, wherein said transporting includes moving the substrate assembly from a loadlock of the sputtering system to a position external to the sputtering system.

28. The method of claim 20, wherein said transporting includes moving the substrate assembly from a position external to the sputtering system, and inserting the substrate assembly into a loadlock of said sputtering system.

29. A method of claim 28, further comprising placing said substrate assembly onto a substrate transfer tray in the loadlock.

30. The method of claim 29, further comprising centering the substrate assembly on the tray.

31. The method of claim 30, wherein said lip of the outer mask does not contact the first surface of the substrate.

32. The method of claim 20, wherein said lip of the outer mask does not contact the first surface of the substrate.

33. The method of claim 20, further comprising:

inserting said substrate assembly into a loadlock of said sputtering system;

placing said substrate assembly onto a substrate transfer tray in the loadlock; and centering the inner mask, outer mask, and substrate relative to the tray.

34. The method of claim 33, wherein during said gripping and said transporting the inner mask and outer mask do not contact the first surface of the substrate.

35. A method of masking a substrate having a first surface that is to be coated in a sputtering system, said substrate having a central first aperture, the method comprising:

providing an inner mask having a first body with a central second aperture at a first end thereof and an opposite second end, said second aperture extending vertically through said first body toward said second end, and an annular head at the first end of said first body around said second aperture, said head extending away from the central aperture; and inserting the first body through said first aperture of the substrate while gripping said inner mask within said second aperture so that a portion of the first surface of the substrate is superimposed by the annular head, wherein said inserting is performed external to said sputtering system; and providing an outermask that includes a hollow second body having a central third aperture and a vertically extending sidewall bounding said third aperture, said third aperture sized so that the substrate can be horizontally disposed within said third aperture, and a lip at a first end of the second body around said third aperture, said lip extending toward said third aperture; and inserting the substrate horizontally into the third aperture of the second body so that a peripheral portion of the first surface of the substrate is superimposed by the lip without being contacted by the lip.

36. The method of claim 35, further comprising providing a surface of at least one of the annular head and lip that is exposed to direct sputter deposition with a rough surface.

37. The method of claim 35, wherein inserting the substrate horizontally into the third aperture of the second body is done external to the sputtering system.

38. The method of claim 37, wherein said inserting the substrate is done while gripping the outer mask on an outer surface of the vertically extending sidewall that is not subject to direct sputter deposition.

39. A method of masking a substrate having a first surface that is to be coated in a sputtering system, said method comprising:

providing an outer mask that includes a hollow body having a central aperture and a vertically extending sidewall bounding said aperture, and a lip at a first end of the body around said aperture, said lip extending toward said aperture; and inserting the substrate horizontally into the aperture of the body so that a peripheral portion of the first surface of the substrate is superimposed by the lip without being contacted by the lip.

40. A method of sputter coating a substrate, said method comprising:

transporting a substrate assembly to a sputtering station in a sputtering system, wherein said substrate assembly includes a substrate having a central first aperture, an inner mask, and an outer mask;

said inner mask including a first body having a central second aperture at a first end thereof, said first body being within said first aperture in the substrate, and an annular head at the first end of said first body around said second aperture, said head superimposing a first surface of the substrate; and said outer mask including a hollow second body having a central third aperture and a vertically extending sidewall bounding said third aperture, and a lip at a first end of the second body around said third aperture, wherein said substrate is horizontally disposed within said third aperture and said lip superimposes a circumferential portion of the first surface of said substrate without contacting the first surface; and sputter depositing material onto the first surface of substrate, the annular head, and the lip; and transporting the substrate assembly from the sputtering station.

41. The method of claim 40, further comprising providing a surface of at least one of the annular head and lip with a rough surface.

42. The method of claim 40, wherein said substrate assembly is supported on a transportable substrate transfer tray during said transporting and said sputter depositing.

43. The method of claim 42, further comprising carrying said substrate assembly to the sputtering system from an external position, inserting the substrate assembly into a loadlock of said sputtering systems, and placing said substrate assembly on the tray in the loadlock.

44. The method of claim 43, further comprising centering the inner mask, outer mask, and substrate of said substrate assembly on said tray.

45. The method of claim 42, further comprising centering the inner mask, outer mask, and substrate of said substrate assembly on said tray.

46. A mask for use in a sputtering system wherein a substrate is to be coated with a material, said mask comprising:

a hollow body having a central aperture and a vertically extending sidewall bounding said aperture, said central aperture sized so that the substrate can be horizontally disposed within said aperture; and a lip at a first end of the body around said central aperture, said lip extending toward said central aperture, wherein said mask is moveable within the sputtering system and a surface of said lip includes numerous asperities, said surface being oriented so as to be exposed to direct sputter deposition.

47. A masking system assembly for use in a sputtering system, wherein a first surface of a substrate having a central first aperture is to be coated with a material, said masking system assembly comprising:

an inner mask, an outer mask, and a substrate transfer tray that are transportable with the substrate within said sputtering system;

said inner mask including a first body that is insertable into said first aperture in the substrate, and an annular head at a first end of said first body around said second aperture, said head extending away from the second aperture and adapted to mask a central portion of the first surface; and said outer mask including a hollow second body having a central third aperture and a vertically extending sidewall bounding said third aperture, said third aperture provided so that the substrate can be horizontally disposed within said third aperture, and a lip at a first end of the second body around said third aperture, said lip extending toward said third aperture, said lip adapted to mask a peripheral portion of the first surface of the substrate; and said substrate transfer tray including a mounting surface, wherein said tray is adapted to support the substrate in a horizontal orientation on said mounting surface within said sputtering system, and said tray is adapted to contact and support the inner and outer masks within said sputtering system.

48. The masking system assembly of claim 47, wherein the first body of the inner mask has a central aperture at the first end of the body, the first aperture having sidewalls and a bottom within the first body.

49. The masking system assembly of claim 47, wherein the tray includes a central fourth aperture at said mounting surface, wherein said fourth aperture is configured so that the first body is supportable therein.

50. The masking system assembly of claim 49, wherein said lip of the outer mask does not contact the first surface of the substrate during sputtering.

51. The masking system assembly of claim 47, wherein the tray further comprises a resilient protrusion within said fourth aperture, said resilient protrusion adapted to supportively contact an outer surface of the body of the inner mask.

52. The masking system assembly of claim 51, wherein said lip of the outer mask does not contact the first surface of the substrate during sputtering.

53. The masking system assembly of claim 47, wherein the tray further comprises a resilient protrusion extending from a peripheral portion of the tray, said resilient protrusion adapted to supportively contact an inner surface of the sidewall of the outer mask within the fourth aperture of the outer mask.

54. The masking system assembly of claim 53, wherein said lip of the outer mask does not contact the first surface of the substrate during sputtering.

55. The masking system assembly of claim 47, wherein at least one of said annular head and said lip include a surface having numerous asperities thereon, said surface being oriented so as to be exposed to direct sputter deposition.

56. The masking system assembly of claim 47, wherein said lip of the outer mask does not contact the first surface of the substrate during sputtering.

57. The masking system assembly of claim 47, wherein the inner mask is adapted to center the substrate relative to the tray, and the tray is adapted to center the outer mask relative to the tray and position the outer mask concentric with the inner mask.

58. The masking system assembly of claim 57, wherein said lip of the outer mask does not contact the first surface of the substrate during sputtering.

59. A method of sputter coating a substrate, said method comprising:

loading a substrate, inner mask, and an outer mask onto a transportable tray in a loadlock of a sputtering system while gripping the inner mask and outer mask, wherein the inner mask masks a central portion of a first surface of the substrate, and the outer mask masks a peripheral portion of the first surface of the substrate;

transporting the substrate assembly to a sputtering station of the sputtering system on the tray;

sputter depositing material onto the first surface of the substrate and onto respective surfaces of the inner mask and outer mask that are oriented in a same direction as said first surface;

transporting the substrate, inner mask, and outer mask on said tray from the sputtering station to the load lock; and unloading the sputtered substrate, inner mask, and outer mask from the loadlock while leaving the tray therein.

* * * * *

UNITED STATES PATENT AND TRADEMARK OFFICE
CERTIFICATE OF CORRECTION

PATENT NO. : 6,264,804 B1
DATED : July 24, 2001
INVENTOR(S) : Lee, Ke Ling, Lee, Ken, Martinson, Robert M. and Mazur, Mikhail It is certified that error appears in the above-identified patent and that said Letters Patent is hereby corrected as shown below:

<u>Column 14,</u>
Line 48, insert "an" before "inner mask".
Line 55, replace "substrate assembly" with -- substrate, inner mask, and outer mask --.

Signed and Sealed this

Thirtieth Day of July, 2002

Attest:

JAMES E. ROGAN
Attesting Officer     Director of the United States Patent and Trademark Office